United States Patent
Nakamura et al.

(10) Patent No.: US 12,283,342 B2
(45) Date of Patent: Apr. 22, 2025

(54) APPARATUSES AND METHODS FOR INPUT BUFFER DATA FEEDBACK EQUALIZATION CIRCUITS

(71) Applicant: MICRON TECHNOLOGY, INC., Boise, ID (US)

(72) Inventors: Kohei Nakamura, Tokyo (JP); Shuichi Tsukada, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 18/055,588

(22) Filed: Nov. 15, 2022

(65) Prior Publication Data

US 2024/0161791 A1 May 16, 2024

(51) Int. Cl.
*G11C 7/10* (2006.01)
*G11C 7/02* (2006.01)
*G11C 7/14* (2006.01)

(52) U.S. Cl.
CPC ............... *G11C 7/106* (2013.01); *G11C 7/02* (2013.01); *G11C 7/14* (2013.01)

(58) Field of Classification Search
CPC .. G11C 7/106; G11C 7/02; G11C 7/14; G11C 7/1006; G11C 11/4074; G11C 11/4099; G11C 11/4091; G11C 7/1087; G11C 7/1093; G11C 11/4093
See application file for complete search history.

(56) References Cited

U.S. PATENT DOCUMENTS

| | | | |
|---|---|---|---|
| 5,117,206 A * | 5/1992 | Imamura | H03L 1/026 257/469 |
| 10,878,858 B2 | 12/2020 | Matsuno et al. | |
| 2016/0065229 A1* | 3/2016 | Kull | H03M 1/002 341/172 |
| 2020/0265879 A1* | 8/2020 | Matsuno | G11C 8/18 |

* cited by examiner

*Primary Examiner* — Jerome Leboeuf
(74) *Attorney, Agent, or Firm* — Dorsey & Whitney LLP

(57) ABSTRACT

Apparatuses, systems, and methods for input buffer data feedback equalization (DFE). An input buffer includes a DFE circuit which adjusts a threshold voltage of the input buffer based on a previously latched data bit. The DFE circuit includes a number of DFE legs coupled in parallel to a node of the input buffer. Each DFE leg is selectively activated by a DFE code. Each DFE leg includes a capacitance (e.g., a field effect transistor) which is coupled to the node in an active leg based on the previously latched data bit. The previously latched data bit may also be used to generate a reset signal which couples the capacitors to ground. Each DFE leg may also include a transistor coupled to a bias voltage, which is stable across a range of PVT variations.

18 Claims, 7 Drawing Sheets

APPARATUSES AND METHODS FOR INPUT BUFFER DATA FEEDBACK EQUALIZATION CIRCUITS

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). When accessed, the memory cell may be coupled to a digit line (or bit line), and a voltage on the digit line may change based on the information stored in the coupled memory cell.

During access operations, the memory may receive a command and activate input buffers or output buffers to receive or send data via input/output pads of the memory device. The input buffers may receive data as voltages at the pads, and latch a signal based on the voltage level in synchronization with a write clock. It may be desirable to ensure that the input buffers properly latch data across a wide range of inter-device variation.

DETAILED DESCRIPTION

Figure 1:
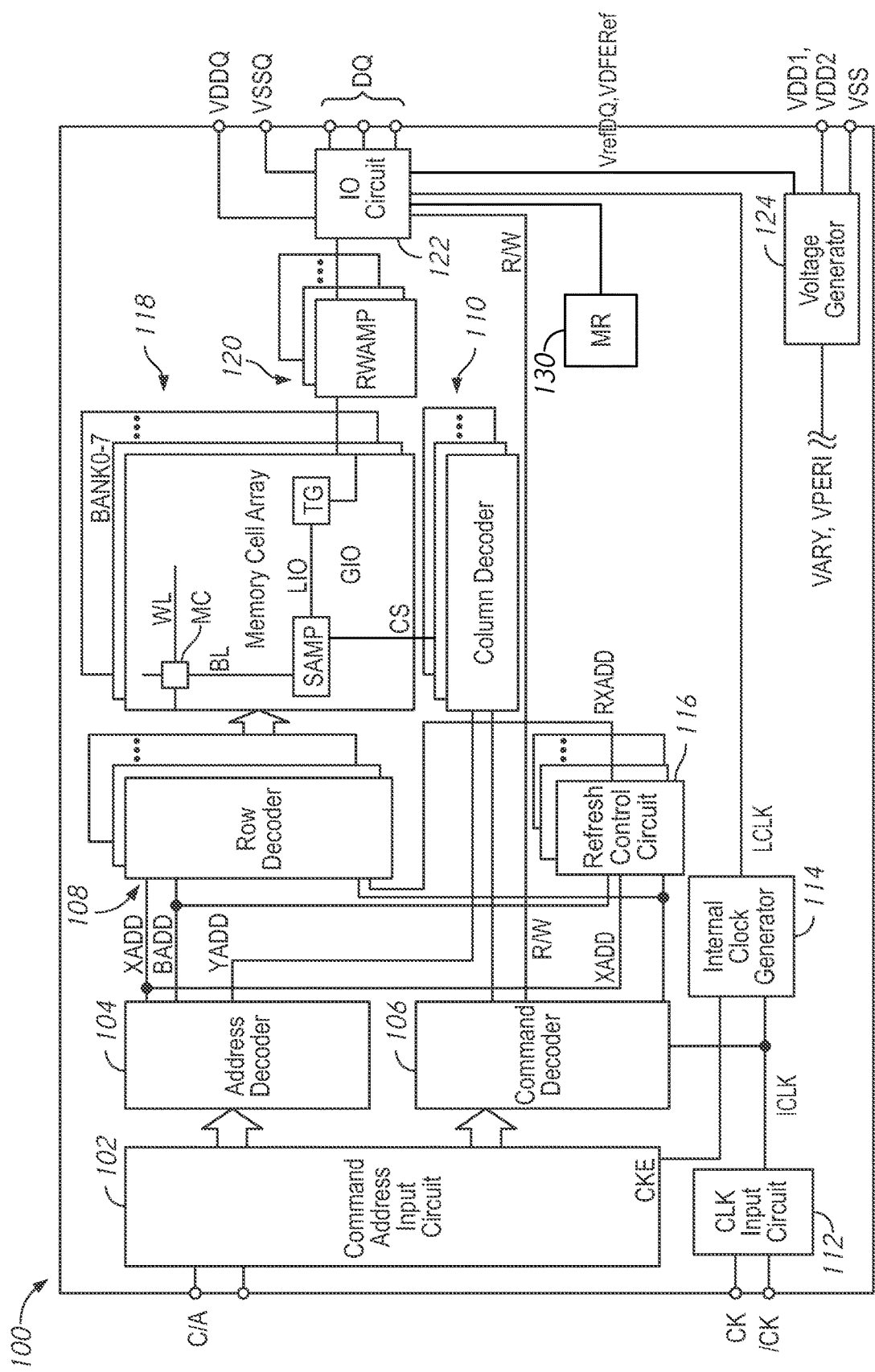
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). During a read operation, the memory may receive a read command and row and column addresses which indicate which memory cell(s) data should be read from. The data is provided to output buffers, and read off from input/output (DQ) pads of the memory. During a write operation, the memory receives a write command and row and column addresses which indicate which memory cell(s) data should be written to. Responsive to the write command, the memory activates a number of input buffers, which allows data to be received from the DQ pads. Each DQ pad may be coupled to a set of input buffers, which may latch data received in series. For example, a first input buffer receives a first serial bit, a second input buffer receives a second serial bit, and so forth.

Each input buffer includes a latch which latches either a logical high or a logical low responsive to a write clock based on a voltage on the input terminal. The latch may have a threshold voltage, and if the voltage on the terminal is above the threshold then a logical high may be latched and if the voltage on the terminal is below the threshold then a logical low may be latched. The input buffers may include data feedback equalizer (DFE) circuits which may set the threshold voltage based on a state of the previous serial bit which was latched along that data terminal. For example, if the previous bit was a logical high, then the threshold may be set to a first threshold voltage, and if the previous bit was a logical low, then the threshold may be set to a second threshold voltage lower than the first threshold voltage. The degree to which the thresholds are adjusted by the DFE circuits may be an adjustable value for example set by a DFE code stored in a mode register of the memory. Memories may experience various factors which may influence inter- and intra-device variability. For example, variations in process, voltage, and temperature (PVT) may affect the operation of various circuits. As requirements for speed and data fidelity increase in memory devices, it may be useful to ensure that variability, such as PVT, has a relatively minimal effect on the operation of the DFE circuits.

The present disclosure is drawn to apparatuses, systems, and methods for input buffer data feedback equalization circuits. Each input buffer has a latch and a DFE circuit, which sets a threshold voltage of the latch based, in part, on a state of a bit latched in a previous input buffer. The DFE circuit receives a DFE code which determines a degree of response of the DFE circuits. Each DFE circuit includes a number DFE legs coupled in parallel between capacitor and a node of the input buffer. Each DFE leg includes a capacitance, and each leg is selectively activated by the DFE code. The capacitance in an active DFE leg is selectively coupled to a node of the input buffer based on a state of the bit in the previous input buffer. A first node is coupled to a DFE circuit where the capacitance is activated by the bit being a first logical state and a second node is coupled to a DFE circuit where the capacitance is activated based on the bit being the second logical state. Which node is coupled to the capacitance determines whether the threshold voltage is adjusted up or down relative to a reference. In other words, how much capacitance is coupled is based on the DFE code, and which node it is coupled to is based on the state of the previous bit. In this way, the number of coupled capacitors (e.g., the DFE code) determines the amount the adjustment to the threshold voltage, and which node they are coupled to (e.g., based on the state of the previous bit) determines which direction the threshold is adjusted. The use of parallel DFE legs (e.g., as opposed to series) and capacitors may increase a linearity in the voltage response of the circuit as the DFE code calls for a larger DFE response.

Each of the parallel DFE legs may have the capacitance coupled in series through a transistor which has a control node coupled to a bias voltage. The bias voltage may help control a response of the DFE leg. The bias voltage may be generated by a bias voltage generator circuit which has a low variability across different PVT conditions. This, alone or in combination with the other aspects described herein, may help stabilize the response of the DFE circuit across different PVT conditions.

The capacitances in the DFE legs may be coupled (through the transistor coupled to the bias voltage) to the respective node of the input buffer when an input bit (e.g., the bit stored in a previous buffer is active). Each DFE circuit includes an inverter circuit which generates a reset signal based on the input bit. When the input bit is inactive (e.g., a low logical level), the inverter provides the reset signal at an active level, which may drain the capacitor to a ground voltage. The use of the inverter may be useful in high speed setups where only a single input (from one previous input buffer) is used.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. As explained in more detail herein, each bank may be further divided into two or more sub-banks. While embodiments where each bank includes two sub-banks are generally described herein, other embodiments may include more sub-banks per bank.

Each memory sub-bank includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. In some embodiments, components such as the row and column decoders and refresh control circuit 116 which are repeated on a per-bank basis may also include components which are repeated on a per-sub-bank basis. For example, there may be a refresh control circuit 116 for each sub-bank.

The bit lines BL are coupled to a respective sense amplifier (SAMP). Read data from the bit line BL is amplified by the sense amplifier SAMP, and transferred to read/write amplifiers 120 over local data lines (LIO), transfer gate (TG), and global data lines (GIO). Conversely, write data outputted from the read/write amplifiers 120 is transferred to the sense amplifier SAMP over the complementary main data lines GIO, the transfer gate TG, and the complementary local data lines LIO, and written in the memory cell MC coupled to the bit line BL.

The semiconductor device 100 may employ a plurality of external terminals, such as solder pads, that include command and address (C/A) terminals coupled to a command and address bus to receive commands and addresses, clock terminals to receive clocks CK and /CK, data terminals DQ coupled to a data bus to provide data, and power supply terminals to receive power supply potentials VDD, VSS, VDDQ, and VSSQ.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

In some embodiments, the clock signals CK and/CK may be divided into multiple phases to generate the internal clocks LCLK. For example, the clock signal CK may be a write clock (e.g., WCK) with a relatively fast period. It may divided into multiple internal clocks LCLK, each of which has a longer period and each of which has a different phase from the other LCLKs. For example, a first internal clock PH0 may have a rising edge at a first rising edge of CK and have a period which is half the period of the clock CK. A second internal signal PH1 may have a rising edge at a first falling edge of CK (e.g., a first rising edge of/CK) and may have the same period of PH0. In other words, PH1 may be 90° out of phase with PH0. Similarly, clock signals PH2 and PH3 may also each be a further 90°out of phase to generate a set of quadrature clocks from the original clock signals. As described in more detail herein, each of the divided clocks may be used to latch bits received in series along the DQ terminals. For example, a first bit may be latched responsive to PH0, a second bit to PH1, and so forth up until a fifth bit is latched by PH0 again and the cycle repeats as needed.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The column decoder 110 may provide a column select signal CS, which may activate a selected one of the sense amplifiers SAMP. The address decoder 104 may also supply a decoded bank address BADD, which may indicate the bank of the memory array 118 containing the decoded row address XADD and column address YADD. The row address XADD may indicate the sub-bank within the bank indicated by BADD.

The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write clocks may be divided into one or more internal clocks LCLK to time the receipt of the data. The input/output circuit 122 receives the data from the DQ terminals by latching logical values with values based on the voltage on the terminal with timing based on the write clocks. The write data is supplied via the input/output circuit 122 to the read/write amplifiers 120, and by the read/write amplifiers 120 to the memory array 118 to be written into the memory cell MC.

The IO circuit 122 includes a number of input buffers, each of which may compare a voltage on the DQ terminal to a threshold to determine if the voltage represents a logical high or a logical low. A number of bits may be received in series along each DQ terminal. The input buffer includes a data feedback equalization circuit, which, when active, may adjust the threshold based on a previous one of the series of bits. For example, if the previous bit was a logical high, a 'high' threshold may be used, and if the previous bit was a logical low, a 'low' threshold may be used. The high threshold may generally represent a higher voltage than the low threshold. The high and low thresholds may represent deviations from a DQ reference voltage VrefDQ. The degree to which the high and low thresholds deviate from VrefDQ (e.g., how far above VrefDQ the high threshold is and how far below VrefDQ the low threshold is) may be a setting of the memory. For example, a mode register 130 may provide a DFE code which may determine how the thresholds are adjusted. The DFE circuits may couple a variable amount of capacitance to nodes of the input buffer, which may adjust the threshold up or down. The amount of the adjustable capacitance is based on the DFE code, and which node it is coupled to (e.g., which direction the threshold voltage is adjusted) is based on a state of a previously latched bit in the series of bits.

The DFE circuits may also receive a bias voltage VDFERef from the voltage generator 124, which may help control the operation of the DFE circuits. The bias voltage VDFEref may be generated by a bias voltage generator circuit of the voltage generator 124. AN example bias voltage generator circuit is discussed in more detail in FIG. 6.

The device 100 includes refresh control circuits 116 each associated with a bank of the memory array 118. Each refresh control circuit 116 may determine when to perform a refresh operation on the associated bank. The refresh control circuit 116 provides a refresh address RXADD (along with one or more refresh signals, not shown in FIG. 1). The row decoder 108 performs a refresh operation on one or more word lines associated with RXADD. The refresh control circuit 116 may perform multiple types of refresh operation, which may determine how the address RXADD is generated, as well as other details such as how many word lines are associated with the address RXADD.

The power supply terminals are supplied with power supply potentials VDD and VSS. The power supply potentials VDD and VSS are supplied to an internal voltage generator circuit 124. The internal voltage generator circuit 124 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
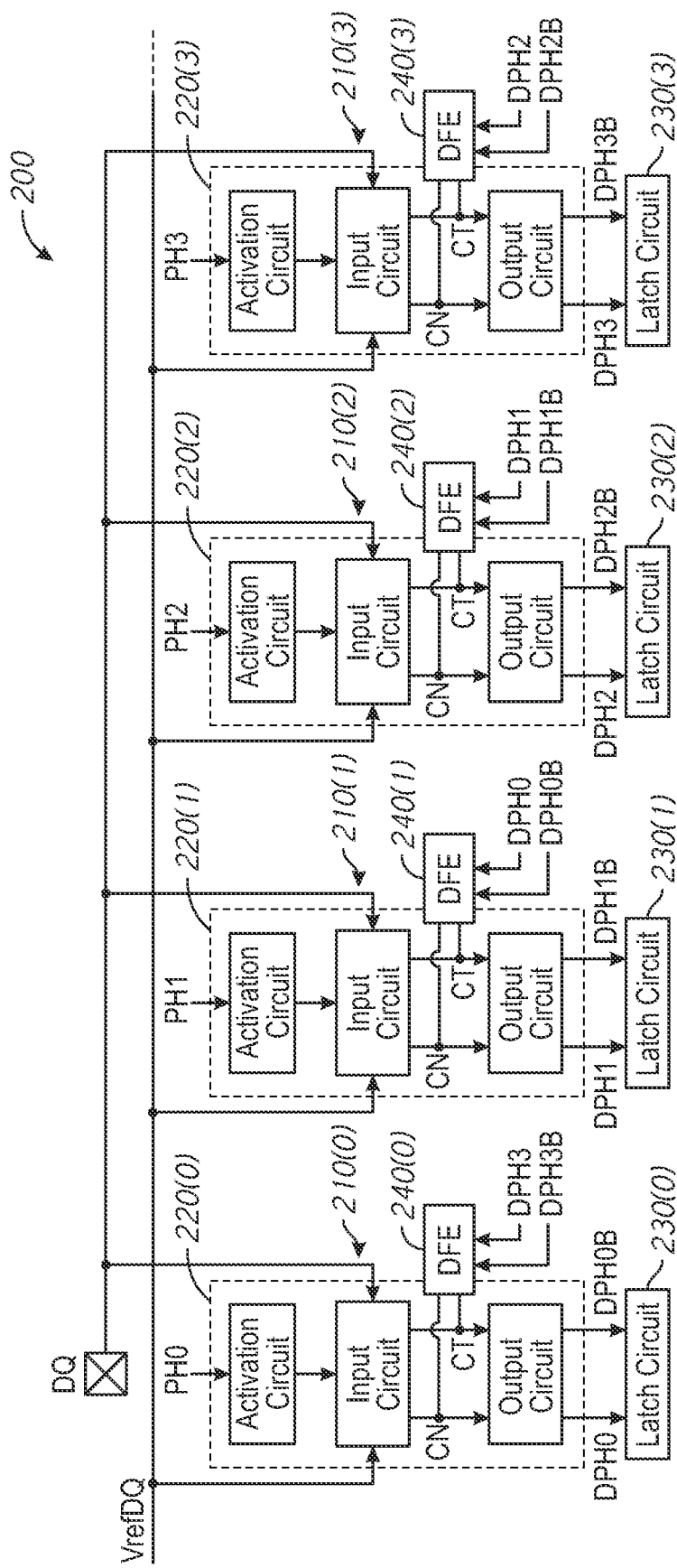
FIG. 2 is a block diagram of an input buffer 200 according to an embodiment of the disclosure.

FIG. 2 is a block diagram of an input buffer 200 according to an embodiment of the disclosure. The input buffer 200 may be included in the input/output circuit 160 of FIG. 1 in some embodiments of the disclosure.

The input buffer 200 receives data serially provided to an external data terminal DQ and latches the data bit-by-bit over one or more clock cycles of multiphase clock signals PH0-PH3. The input buffer 200 includes input buffer circuits 210(0)-210(3) that are coupled to the external data terminal DQ and coupled to a reference voltage supply line on which a data reference voltage VrefDQ is provided. In some embodiments of the disclosure, each external data terminal DQn of a semiconductor device (e.g., semiconductor device 100 of FIG. 1) may have a corresponding input buffer, such as input buffer 200.

Each of the input buffer circuits 210(0)-210(3) is provided a respective one of the multiphase clock signals. For example, the input buffer circuit 210(0) is provided clock PH0, the input buffer circuit 210(1) is provided clock PH1, the input buffer circuit 210(2) is provided clock PH2, and the input buffer circuit 210(3) is provided clock PH3. Each of the multiphase clock signals PH0-PH3 may have a different phase from one another. For example, in some embodiments of the disclosure, the multiphase clock signals PH0-PH3 have a 90 degree phase relative to one another (e.g., "quadrature" clock signals). The PH0 clock may have a 0 degree phase, the PH1 clock may have a 90 degree phase, the PH2 clock may have a 180 degree phase, and the PH3 clock may have a 270 degree phase. Other embodiments of the disclosure may have multiphase clock signals with other relationships to one another. The number of input buffers 210 and the number of divided clocks may vary in other embodiments.

The input buffer circuit 210(0) includes a sense circuit 220(0) coupled to the external data terminal DQ and the VrefDQ voltage supply line. The sense circuit 220(0) includes and activation circuit that is provided the respective multiphase clock PH0. When activated by the PH0 clock (e.g., high clock level), an input circuit of the sense circuit 220(0) senses a voltage difference between a voltage at the external data terminal DQ and the VrefDQ voltage of the voltage supply line and provides respective voltages to sense nodes CN and CT based on the voltage difference between the DQ voltage and VrefDQ voltage. For example, the input circuit compares the voltage at the external data terminal DQ with the VrefDQ voltage and provides voltages to the CN and CT nodes based on the comparison. An output circuit of the sense circuit 220(0) provides sense outputs to a latch circuit 230(0) that are based on the voltages of the CN and CT nodes and a reference level (which may be a threshold or trip point level of input buffer circuit 210) set by a decision feedback equalizer (DFE) circuit 240(0) coupled to the CN and CT nodes. The latch circuit 230(0) latches and provides output data DPH0 and DPH0B having logic levels based on the sense outputs. The output data DPH0 and DPH0B may be complementary. That is, one of the output data DPH0 and DPH0B may have a first logic level (e.g., "0" logic level) and the other output data will have a second logic level that is the opposite of the first logic level (e.g., "1" logic level), or vice versa.

The DFE circuit 240(0) is provided output data DPH(n−1) and DPH(n−1)B from another one of the input buffer circuits 210. The DFE circuit 240(0) may set a threshold or reference level for the sense circuit 220(0) based on the output data DPH(n−1) and DPH(n−1)B from the other input buffer circuit 210. For example, the DFE circuit 240(0) may set the threshold level by changing (e.g., shifting) the threshold level from a first voltage level to a second voltage level, or vice versa. The DFE circuit 240(0) may also set the reference level by maintaining the reference level from a previous reference level. The threshold level set by the DFE circuit 240(0) may be relative to the reference voltage VrefDQ (e.g., higher than the reference voltage VrefDQ or lower than the reference voltage VrefDQ. The DFE circuit 240(0) may couple a variable amount of capacitance to the sense nodes CN and CT to set the reference level to improve sensing accuracy of the data at the external data terminal DQ. The capacitances provided by the DFE circuit to the sense nodes CN and CT may be based on the output data DPH(n−1) and DPH(n−1)B from the other sense circuit 220, a DFE bias voltage VDFEref, as well as settings of the device (e.g., a DFE code stored in a mode register). For example, the amount of capacitance may be set by a DFE code, and which node CN or CT the capacitance is coupled to may be determined by output data DPH(n−1) and DPH(n−1)B.

The input buffer circuits 210(1)-210(3) are similar to the input buffer circuit 210(0), and the description for input buffer circuit 210(0) applies to the input buffer circuits 210(1) 210(3) accordingly.

In operation, the DFE circuit 240(0) sets a threshold level (e.g., a high threshold level or a low threshold level) based on the output data DPH(n−1) and DPH(n−1)B from another sense amplifier and a bias voltage VDFEref. For example, when the output data DPH(n−1) is a high logic level (e.g., a high logic level voltage) and the output data DPH(n−1)B is a low logic level (e.g., a low logic level voltage), the DFE circuit 240(0) may effectively increase the threshold level for the input buffer circuit 210(0) relative to the VrefDQ voltage. In contrast, when the output data DPH(n−1) is a low logic level and the output data DPH(n−1)B is a high logic level, the DFE circuit 240(0) may decrease a voltage of the threshold level for the input buffer circuit 210(0) relative to the VrefDQ voltage. Thus, the DFE circuit 240(0) sets a reference level for the input buffer circuit 210(0) based on the output data DPH(n−1) and DPH(n−1)B from the other input buffer circuit 210. The degree to which the threshold is raised or lowered may be based on DFE code (not shown in FIG. 2).

An active PH0 clock activates the input circuit of the sense circuit 220(0) to compare a voltage at the external node DQ and the VrefDQ voltage. Based on the comparison (e.g., voltage difference), the input circuit provides voltages to the sense nodes CN and CT. The sense nodes CN and CT each develop a respective voltage that is influenced by the DFE circuit 240(0). The output circuit provides sense outputs to the latch circuit 230(0) based on the voltages at the CN and CT nodes. The latch circuit 230(0) latches and provides output data DPH0 and DPH0B having respective logic levels based on the sense outputs. The latch circuit 230(0) provides output data DPH0 and DPH0B, one having the latched logic level and the other having the complementary logic level. The sense circuit 220(0) becomes inactive with an inactive PH0 clock, and the sense nodes CN and CT may be changed and outputs of the input buffer circuit 210(0) may be changed to respective an initial voltages in preparation for a next activation (e.g., the input buffer circuit 210(0) is precharged). The sense circuit 220(0) remains inactive until a next active PH0 clock.

As previously described, each of the input buffer circuits 210(0)-210(3) receive a respective clock signal having a different phase from the clock signals provided to the other input buffer circuits 210. The sense circuits 220(0)-220(3) are activated at different phases by the PH0-PH3 clocks as a result.

Figure 3:
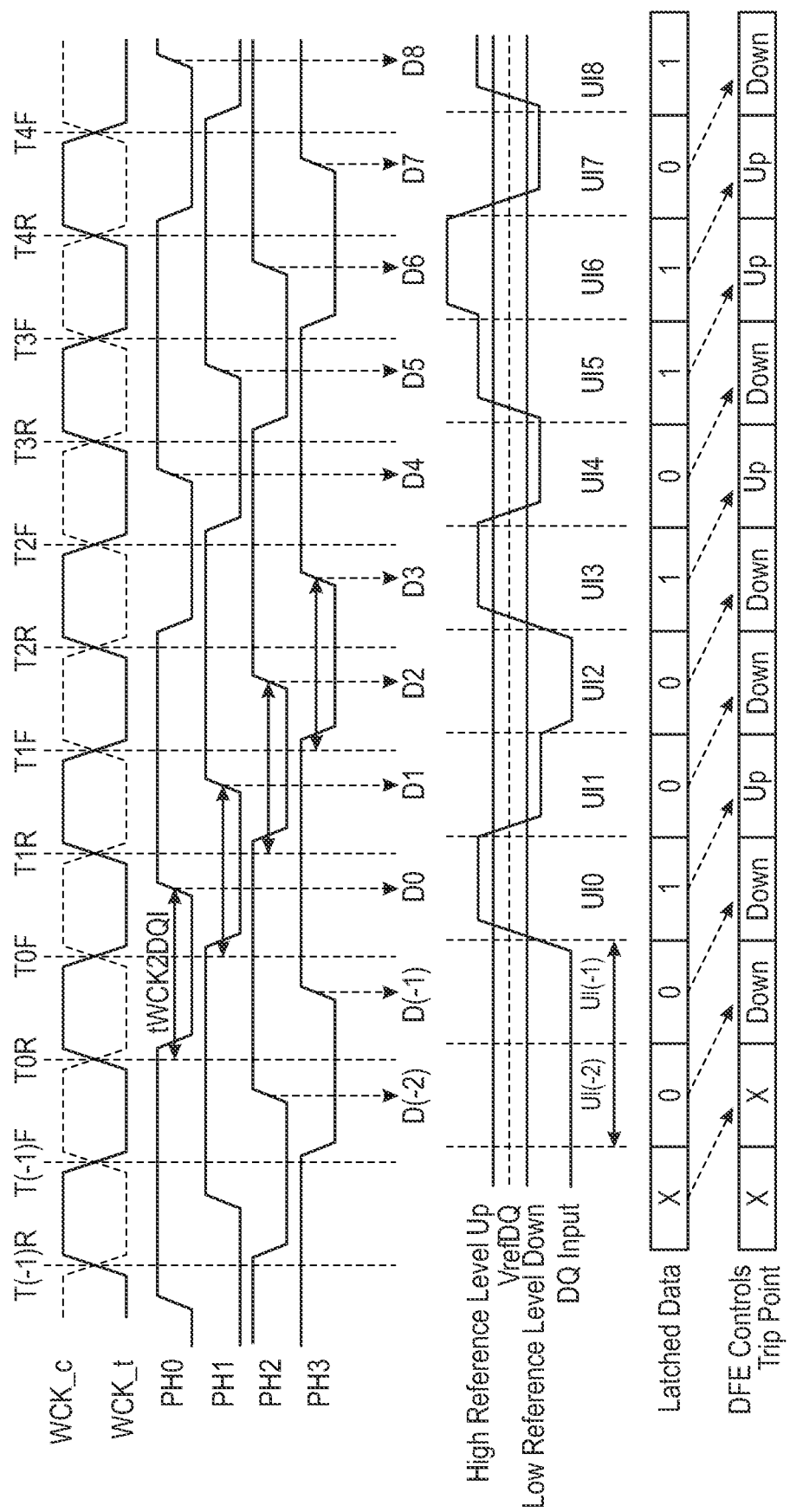
FIG. 3 is a timing diagram of various clock signals and voltages during operation of a plurality of input buffers according to an embodiment of the disclosure.

FIG. 3 is a timing diagram of various clock signals and voltages during operation of a plurality of input buffers according to an embodiment of the disclosure. The example operation of FIG. 3 shows multiple bits (e.g., preamble bits D(−2) and D(−1), and data bits D0-D8) input to the input buffers. The timing diagram of FIG. 3 may show operation of an input buffer included in the input/output circuit 160 of FIG. 1 and/or the input buffer circuits 210(0)-210(3) of FIG. 2 in some embodiments of the disclosure.

FIG. 3 shows clock signals WCK_t and WCK_c, and further shows multiphase clock signals PH0, PH1, PH2, and PH3. In the example operation of FIG. 3, the multiphase clock signals PH0-PH3 have lower clock frequencies than the WCK_t and WCK_c clock signals, and have different phases from one another. For example, the multiphase clock signals PH0-PH3 have one-half the clock frequency of the WCK_t and WCK_c clock signals, and multiphase clock signals PH0-PH3 have a 90 degree phase relative to one another (e.g., PH0=0 degrees, PH1=90 degrees, PH2=180 degrees, and PH3=270 degrees).

A data reference voltage VrefDQ and a voltage of the external data terminal DQ is also shown in FIG. 3. A High Reference Level Up (e.g., a high threshold) and a Low Reference Level Down (e.g., a low threshold) for the input buffers are also shown in FIG. 3. A threshold level for an input buffer circuit is set to the High Reference Level Up or the Low Reference Level Down by respective DFE circuits of the input buffer based on a previous data bit in the series and a bias voltage.

The example operation of FIG. 3 will be described with reference to the input buffer circuits 210(0)-210(3).

Prior to time T0R, the external data terminal DQ has a same voltage for two data unit intervals (UI). Each UI in the example operation of FIG. 3 is one-half a clock period of the WCK_t and WCK_c clock signals. The write clocks WCLK_t and WCLK_c may be complimentary to each other and may be provided as the clocks CK and/CK of FIG. 1. With reference to the voltage of the external data terminal DQ for UI(-1), a rising edge and high clock level of the PH3 clock following time T0R activates the sense circuit 220(3) of the input buffer circuit 210(3) to sense a low voltage relative to the VrefDQ voltage. The sense circuit 220(3) provides sense outputs based on the relatively lower voltage of the external data terminal DQ and the reference level set for the input buffer circuit 210(3), which causes the latch circuit 230(3) to latch a low logic level for data D(-1) and provide a low logic level voltage for DPH3 and a high logic level voltage for DPH3B.

The low logic level of DPH3 and the high logic level of DPH3B are provided to the DFE circuit 240(0) of the input buffer circuit 210(0). The DFE circuit 220(0) sets the threshold level of the input buffer circuit 210(0) based on the logic levels of DPH3 and DPH3B. For example, in the example operation of FIG. 3, based on the low logic level DPH3 and high logic level DPH3B, the DFE circuit 240(0) sets the reference level for the input buffer circuit 210(0) to the Low Reference Level Down.

Following the latching of the low logic level for data D(-1), the voltage of the external data terminal DQ changes to a higher voltage for UI0. A rising edge of the PH0 clock occurs at a time tWCK2DQI following a clock edge of the WCK_t clock at time T0R. The time tWCK2DQI may be a timing specification for a rising edge of a multiphase clock signal following a corresponding clock edge (e.g., rising edge or falling edge) of the WCK_t clock. In more detail, the time tWCK2DQI is the propagation delay time from WCK_T/WCK_N to PH0-PH3 in FIG. 1. The rising edge and high clock level of the PH0 clock activates the sense circuit 220(0) of the input buffer circuit 210(0) to sense a voltage that is greater relative to the Low Reference Level Down set by the DFE circuit 240(0). The sense circuit 220(0) provides sense outputs based on the relatively higher voltage of the external data terminal DQ and the reference level set for the input buffer circuit 210(0). As a result, the latch circuit 230(0) latches a high logic level for data D0 and provides a high logic level voltage for DPH0 and a low logic level voltage for DPH0B.

The high logic level of DPH0 and the low logic level of DPH0B is provided to the DFE circuit 220(1) of the input buffer circuit 210(1). The DFE circuit 220(1) sets the reference level of the input buffer circuit 210(1) based on the logic levels of DPH0 and DPH0B. For example, based on the high logic level DPH0 and low logic level DPH0B, the DFE circuit 240(1) sets the reference level for the input buffer circuit 210(1) to the High Reference Level Up.

Following the latching of the high logic level for data D(0), the voltage at the external data terminal DQ changes to a lower voltage for UI1. A rising edge of the PH1 clock occurs at a time tWCK2DQI following a clock edge of the WCK_t clock at time T0F. The rising edge and high clock level of the PH1 clock activates the sense circuit 220(1) of the input buffer circuit 210(1) to sense a voltage that is lower relative to the High Reference Level Up set by the DFE circuit 240(1). The sense circuit 220(1) provides sense outputs based on the relatively lower voltage of the external data terminal DQ and the reference level set for the input buffer circuit 210(1). As a result, the latch circuit 230(1) latches a low logic level for data D1 and provides a low logic level voltage for DPH1 and a high logic level voltage for DPH1B.

The low logic level of DPH1 and the high logic level of DPH1B is provided to the DFE circuit 240(2) of the input buffer circuit 210(2). Based on the low logic level DPH1 and high logic level DPH1B, the DFE circuit 240(2) sets the reference level for the input buffer circuit 210(2) to the Low Reference Level Down.

Following the latching of the high logic level for data D1, the voltage at the external data terminal DQ decreases to a lower voltage for UI2. A rising edge of the PH2 clock occurs at a time tWCK2DQI following a clock edge of the WCK_t clock at time T1R. The rising edge and high clock level of the PH2 clock activates the sense circuit 220(2) of the input buffer circuit 210(2) to sense a voltage that is lower relative to the Low Reference Level Down set by the DFE circuit 240(2). The sense circuit 220(2) provides sense outputs based on the relatively lower voltage of the external data terminal DQ and the reference level set for the input buffer circuit 210(2). As a result, the latch circuit 230(2) latches a low logic level for data D2 and provides a low logic level voltage for DPH2 and a high logic level voltage for DPH2B.

The low logic level of DPH2 and the high logic level of DPH2B is provided to the DFE circuit 240(3) of the input buffer circuit 210(3). Based on the low logic level DPH2 and high logic level DPH2B, the DFE circuit 240(3) sets the reference level for the input buffer circuit 210(3) to the Low Reference Level Down.

Following the latching of the low logic level for data D(2), the voltage at the external data terminal DQ for UI2 changes to a higher voltage for UI3. A rising edge of the PH3 clock occurs at a time tWCK2DQI following a clock edge of the WCK_t clock at time T1F. The rising edge and high clock level of the PH3 clock activates the sense circuit 220(3) of the input buffer circuit 210(3) to sense a voltage that is higher relative to the Low Reference Level Down set by the DFE circuit 240(3). The sense circuit 220(3) provides sense outputs based on the relatively higher voltage of the external data terminal DQ and the reference level set for the input buffer 210(3). As a result, the latch circuit 230(3) latches a high logic level for data D3 and provides a high logic level voltage for DPH3 and a low logic level voltage for DPH3B.

The high logic level of DPH3 and the low logic level of DPH3B is provided to the DFE circuit 240(0) of the input buffer circuit 210(0). Based on the high logic level DPH3 and low logic level DPH3B, the DFE circuit 240(0) sets the reference level for the input buffer circuit 210(0) to the High Reference Level Up.

Following the latching of the four data bits D0-D3 over one clock cycle of the multiphase clock signals, additional data bits D4-D7 are latched over another clock cycle of the multiphase clock signals.

The voltage at the external data terminal DQ changes to a lower voltage for UI4. A rising edge of the PH0 clock during UI4 and the high clock level of the PH0 clock activates the sense circuit 220(0) of the input buffer circuit 210(0) to sense a voltage that is lower relative to the High Reference Level Up set by the DFE circuit 240(0). The sense circuit 220(0) provides sense outputs based on the relatively lower voltage of the external data terminal DQ and the reference level set for the input buffer circuit 210(0). As a result, the latch circuit 230(0) latches a low logic level for data D4 and provides a low logic level voltage for DPH0 and a high logic level voltage for DPH0B.

The low logic level of DPH0 and the high logic level of DPH0B is provided to the DFE circuit 240(1) of the input buffer circuit 210(1). Based on the low logic level DPH0 and high logic level DPH0B, the DFE circuit 240(1) sets the reference level for the input buffer circuit 210(1) to the Low Reference Level Down.

Following the latching of the high logic level for data D4, the voltage at the external data terminal DQ for UI4 changes to a higher voltage for UI5. A rising edge of the PH1 clock during UI5 and the high clock level of the PH1 clock activates the sense circuit 220(1) of the input buffer circuit 210(1) to sense a voltage that is higher relative to the low reference level Down set by the DFE circuit 240(1). The sense circuit 220(1) provides sense outputs based on the relatively higher voltage of the external data terminal DQ and the reference level set for the input buffer circuit 210(1). As a result, the latch circuit 230(1) latches a high logic level for data D5 and provides a high logic level voltage for DPH1 and a low logic level voltage for DPH1B.

The high logic level of DPH1 and the low logic level of DPH1B is provided to the DFE circuit 240(2) of the input buffer circuit 210(2). Based on the high logic level DPH1 and low logic level DPH1B, the DFE circuit 240(2) sets the reference level for the input buffer circuit 210(2) to the high reference level Up.

Following the latching of the low logic level for data D5, the voltage at the external data terminal DQ for UI5 increases to a higher voltage for UI6. A rising edge of the PH2 clock during UI6 and the high clock level of the PH2 clock activates the sense circuit 220(2) of the input buffer circuit 210(2) to sense a voltage that is higher relative to the high reference level Up set by the DFE circuit 240(2). The sense circuit 220(2) provides sense outputs based on the relatively higher voltage of the external data terminal DQ and the reference level set for the input buffer circuit 210(2). As a result, the latch circuit 230(2) latches a high logic level for data D6 and provides a high logic level voltage for DPH2 and a low logic level voltage for DPH2B.

The high logic level of DPH2 and the low logic level of DPH2B is provided to the DFE circuit 240(3) of the input buffer circuit 210(3). Based on the high logic level DPH2 and low logic level DPH2B, the DFE circuit 240(3) sets the reference level for the input buffer circuit 210(3) to the High Reference Level Up.

Following the latching of the low logic level for data D6, the voltage at the external data terminal DQ for UI6 changes to a lower voltage for UI7. A rising edge of the PH3 clock during UI7 and the high clock level of the PH3 clock activates the sense circuit 220(3) of the input buffer circuit 210(3) to sense a voltage that is lower relative to the High Reference Level Up set by the DFE circuit 240(3). The sense circuit 220(3) provides sense outputs based on the relatively lower voltage of the external data terminal DQ and the reference level set for the input buffer circuit 210(3). As a result, the latch circuit 230(3) latches a low logic level for data D7 and provides a low logic level voltage for DPH3 and a high logic level voltage for DPH3B.

The low logic level of DPH3 and the high logic level of DPH3B is provided to the DFE circuit 240(0) of the input buffer circuit 210(0). Based on the low logic level DPH3 and high logic level DPH3B, the DFE circuit 240(0) sets the reference level for the input buffer circuit 210(0) to the Low Reference Level Down.

Data D8 is latched by the latch circuit 230(0) of the input buffer circuit 210(0) during UI8 in a manner similar to that previously discussed.

Figure 4:
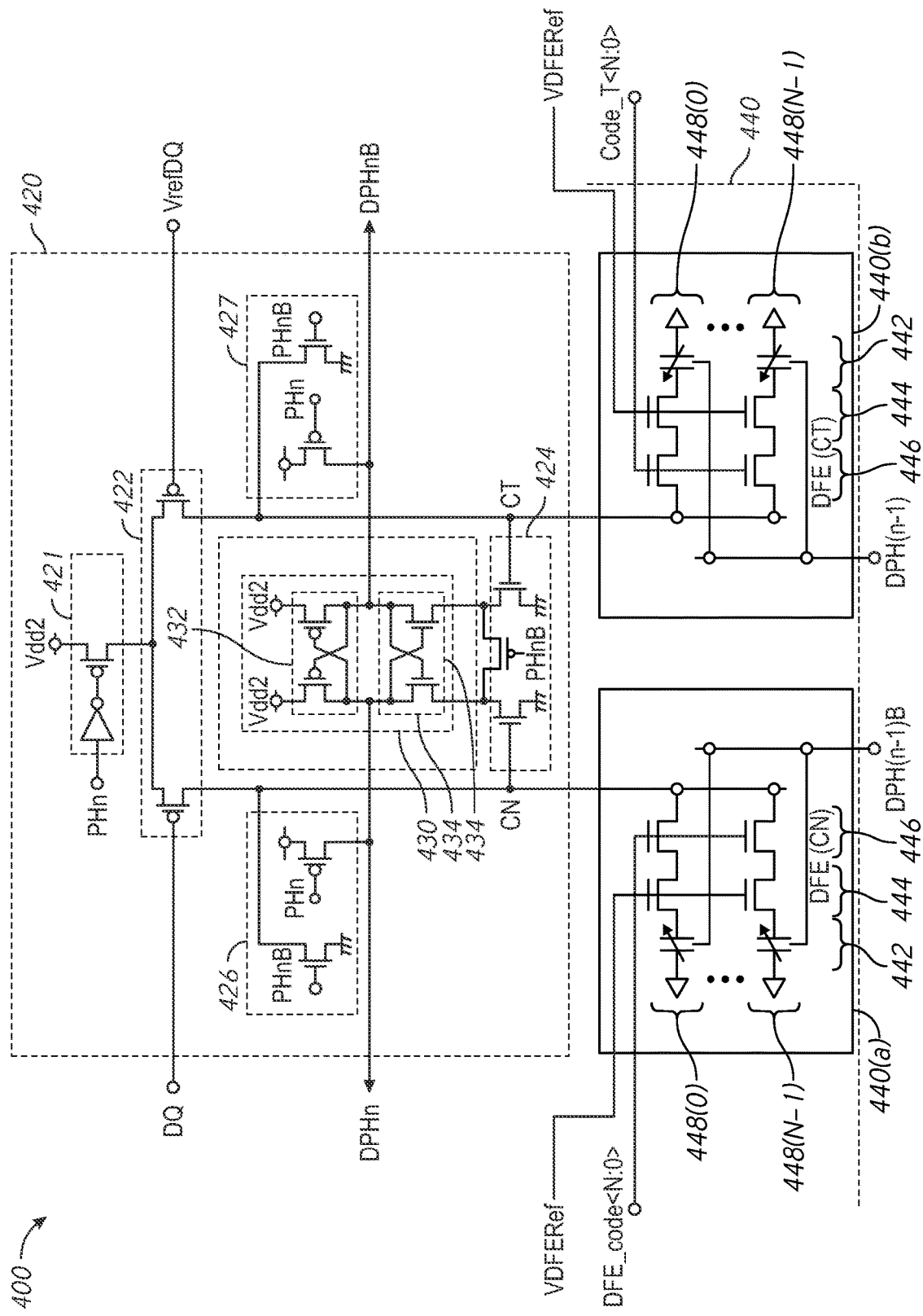
FIG. 4 is a schematic diagram of an input buffer circuit 400 according to an embodiment of the disclosure.

FIG. 4 is a schematic diagram of an input buffer circuit 400 according to an embodiment of the disclosure. The input buffer circuit 400 may be included in an input buffer including in the input/output circuit 122 of FIG. 1 and/or the input buffer 200 of FIG. 2 in some embodiments of the disclosure.

The input buffer circuit 400 includes a sense circuit 420 coupled to a latch circuit 430, and further includes a decision feedback equalizer (DFE) circuit 440. The DFE circuit is divided into two parts 440(a) and 440(b) one for each of two nodes CN and CT of the sense circuit 420. The two parts of the DFE circuit 440 may generally be similar to each other.

The sense circuit 420 is provided a clock PHn (and complementary clock PHnB in some embodiments of the disclosure), and further provided a data reference voltage VrefDQ and data on an external data terminal DQ to which the input buffer circuit 400 is coupled. The PHn clock may be a clock from a plurality of multiphase clock signals, and have a phase relationship to the other clocks of the multiphase clock signals.

The sense circuit 420 includes an activation circuit 421 that provides power from a power supply (e.g., vdd2) when the PHn clock is active (e.g., a high clock level). The activation circuit 421 may include an inverter circuit and a p-channel transistor (e.g., P-type field effect transistor) coupled to the power supply as shown in FIG. 4. However, some embodiments of the disclosure may include an activation circuit 421 including alternative and/or additional circuits. Power from the activation circuit 421 is provided to the input circuit 422.

The input circuit 422 is coupled to output circuit 424 of the sense circuit 420 at sense nodes CN and CT. A first input transistor of the input circuit 422 is provided data from the external terminal DQ and a second input transistor of the input circuit 422 is provided the VrefDQ voltage. The first input transistor is coupled to a first output transistor of the output circuit 424 and the second input transistor is coupled to a second output transistor of the output circuit 424. The first and second input transistors of the input circuit 422 may be implemented as p-channel transistors and the first and second output transistors of the output circuit 424 may be implemented as n-channel transistors as shown in FIG. 4. However, the input circuit 422 and the output circuit 424 may be implemented using different circuits in other embodiments of the disclosure. In some embodiments of the disclosure, the p-channel transistors of the input circuit 422 may be low threshold voltage (Vt) devices (e.g., Vt in a range of 100-300 mV). The p-channel transistors of the input circuit 422 may be matched, for example, having the same circuit layout as one another. Similarly, The n-channel transistors of the output circuit 424 may be matched, for example, having the same circuit layout as one another. Other arrangements for the activation circuit 422 may be used in other example embodiments. For example, the present disclosure is generally described with respect to a device where the DQ pin is terminated to a ground voltage (e.g., VSS) and so the input circuit 422 includes p-channel transistors. However, in some embodiments, a voltage representing a high logical level (e.g., Vdd2) may be used to terminate the DQ pins and n-channel transistors may be used in the activations circuit 422 instead. In such an embodiment, other changes may be also be made for example to the circuit which generates the bias voltage VDFERef.

When activated by the PHn clock, the input circuit 422 of the sense circuit 420 compares a voltage at the external data terminal DQ and the VrefDQ voltage and provides respective voltages to the CN and CT nodes. The output circuit 424 of the sense circuit 420 provides sense outputs having respective voltage levels based on the voltages provided to the CN and CT nodes and the reference level set by the DFE circuit 440.

The sense circuit 420 further includes precharge circuits 426 and 427. The precharge circuit 426 is coupled to the sense node CN and to a first output at which output data DPHn is provided. The precharge circuit 427 is coupled to the sense node CT and to a second output at which output data DPHnB is provided. FIG. 4 shows an embodiment of the disclosure where the precharge circuits 426 and 427 may each include a p-channel transistor to precharge the respective output and further include an n-channel transistor to precharge the sense node CN/CT. Other embodiments of the disclosure may have precharge circuits including different circuits. The precharge circuits 426 and 427 precharge the sense nodes CN and CT, and precharge the outputs to initial voltages when the PHn clock is inactive (e.g., a low clock level). For example, the precharge circuits 426 and 427 may provide a first precharge voltage to sense nodes CN and CT and may provide a second precharge voltage to the first and second outputs. In some embodiments of the disclosure, the first precharge voltage may be a reference voltage, such as ground, and the second precharge voltage may be a power supply voltage, such as vdd2.

The latch circuit 430 includes cross-coupled p-channel transistors 432 and cross-coupled n-channel transistors 434 that are coupled to the first and second outputs at which output data DPHn and DPHnB are provided. The cross-coupled p-channel transistors 432 are provided power from a power supply (e.g., vdd2) and the cross-coupled n-channel transistors 434 are coupled to the output circuits 424. The latch circuit 430 latches and provides the output data DPHn and DPHnB having logic levels based on the sense outputs from the sense circuit 420. The p-channel transistors may be matched to one another and the n-channel transistors may be matched to one another. For example, in some embodiments of the disclosure, the p-channel transistors and/or n-channel transistors have the same circuit layout as one another.

The DFE circuit 440 is coupled to the sense nodes CN and CT, and includes adjustable capacitance 442 coupled to the sense node CT or CN. A first portion of the DFE circuit 440(a) is coupled to the sense node CN, and a second portion of the DFE circuit 440(b) is coupled to the sense node CT. Each of the DFE portions 440(a,b) includes a number of DFE legs 448 coupled in parallel to the respective sense node. The DFE legs 448 each include a capacitance 442. The DFE legs 448 are selectively activated by the DFE code DFE_code. The whether the capacitance 442 in an active DFE leg 448 is coupled to the respective node is determined by the data DPH(n-1) and DPH(n-1)B latched in a different input buffer (e.g., the previous bit in the series of bits). Each of the DFE legs 448 receives a bias voltage VDFERef, which may help stabilize the effect of coupling more or fewer DFE legs 448 to the node CT or CN. Since the data DPH(n-1) and DPH(n-1)B may generally be complimentary to each other, the state of the bit may determine if the capacitance 442 are coupled to the node CN or the node CT. Increasing the capacitance of the node CN may increase the threshold voltage of the circuit 400, while increasing the capacitance of the node CT may decrease the threshold voltage of the circuit 400.

The data DPH(n-1) and DPH(n-1)B are data from another input buffer circuit. For example, in some embodiments of the disclosure, the data DPH(n-1) and DPH(n-1)B are provided by an input buffer circuit that is activated by a clock PH(n-1) having an earlier phase than the PHn clock, where both clocks are included in a set of multiphase clock signals. For example, for quadrature multiphase clock signals, and where the input buffer circuit 400 is activated by a 0 degree clock, the data DPH(n-1) and DPH(n-1)B are provided by an input buffer circuit that is activated by a 270 degree clock. In another example, where the input buffer circuit 400 is activated by a 90 degree clock, the data DPH(n-1) and DPH(n-1)B are provided by an input buffer circuit that is activated by a 0 degree clock.

The number of active DFE legs 448 provides a variable amount of capacitance (by making more or fewer of the capacitances 442 available to be coupled to the sense node) that may be set by a DFE code DFE_code<N:0>. The DFE_code may be a value programmed in a mode register (not shown). The DFE_code<N:0> code may include one or more bits, where N is an integer greater than or equal to zero. The bits of DFE_code<N:0> may selectively activate the legs 448 by activating transistors 446 to couple the respective leg 448 to the node. For example, a first bit DFE_code<0> may activate a first leg 448(0), a second bit DFE_code<1> may activate a second leg 448(1) and so on up to DFE_code<N> and leg 448(N).

Changing the code DFE_code changes an amount of variable capacitance which can coupled to the respective node when activated by the corresponding data DPH(n-1) or DPH(n-1)B. For example, when the DFE_code has a maximum value (e.g., all logical highs) a maximum capacitance may be coupled to the node, and when the DFE_code has a minimum value (e.g., all logical lows) no extra capacitance is coupled to the node. The effect that the capacitance one the threshold is based on a logical state of the previous data bits DPH(n-1) and DHP(n-1)B (e.g., which note the capacitance is coupled to). The size of that effect is based on the DFE_code (e.g., how many capacitances are coupled). In other words, the size by which the DFE circuits 440 cause the threshold voltage to deviate from VrefDQ is based on DFE_code and the direction of that deviation is based on DPH(n-1) and DPH(n-1)B. For example, if the DFE code has a minimum value (e.g., none of the legs 448 are active), then the DFE circuit may be disabled and the threshold may remain on or about VrefDQ regardless of a state of the previous bit. As the DFE_code increases, a value DPH(n-1) at a logical high (and thus DPH(n-1)B at a logical low) may cause the threshold to get higher above VrefDQ, and a value DPH(n-1) at a logical low (and thus DPH(n-1)B at a logical high) may cause the threshold to decrease more and more below VrefDQ.

Each of the DFE legs 448 includes a transistor 446 and a transistor 444 coupled in series between the adjustable capacitance 442 and the node. The transistor 446 has a control node (e.g., a gate) coupled to a bit of the DFE_code and may act as a switch to selectively activate the DFE leg 440. The transistor 444 has a control node coupled to a bias voltage VDFEref. The bias voltage VDFEref is relatively stable across PVT variations, which may in turn help stabilize the overall effect of the DFE circuit 440 on the response of the input buffer 400 with respect to PVT variation. The adjustable capacitance 442 may be coupled between the transistor 444 and a ground voltage (e.g., VSS).

In an active DFE leg 448, whether the capacitance is coupled to the corresponding node is based on an input voltage. The input voltage may be output data from a previous input buffer (e.g., DPH(n−1). In some embodiments, the capacitance 442 may be provided by a field effect transistor (FET) such as a MOSFET. In some embodiments of the disclosure, each of the plurality of capacitors 442 of the adjustable capacitance may provide a different level of adjustable capacitance. For example, each of the capacitors may be a different size, which provides different capacitances. This may allow for more adjustment of the overall levels of capacitance based on the DFE_code.

The DFE circuit 440 may set a threshold level for the input buffer circuit 400 based on the output data DPH(n−1) and DPH(n−1)B from the other input buffer circuit. The sense circuit 420 uses the threshold or reference level to determine whether voltage for data provided to the external data terminal DQ while the input buffer circuit is activated represents a high logic level (e.g., output data DPHn is a high logic level and DPHnB is a low logic level) or a low logic level (e.g., output data DPHn is a low logic level and DPHnB is a high logic level). The threshold may be based on whether the DFE circuit 440 couples the capacitances in the active number of DFE legs to the node CN or CT.

In some embodiments of the disclosure, the DFE circuit 440 sets the reference level to a first reference level or a second reference level based on the output data DPH(n−1) and DPH(n−1)B from the other input buffer circuit. For example, the DFE circuit 440 may set the reference level of the input buffer circuit 400 to high reference level that is effectively higher than a reference level of the VrefDQ voltage or to a low reference level that is effectively lower than a reference level of the VrefDQ voltage based on the output data DPH(n−1) and DPH(n−1)B. The degree to which the high reference level is above VrefDQ and to which the low reference level is below VrefDQ may be set based on the DFE_code.

The levels of the first and second reference levels may be relative to the VrefDQ voltage. For example, a high reference level may be greater than the VrefDQ voltage by an amount and a low reference level may be less than the VrefDQ voltage by the amount. The amount of deviation of the high and low reference levels from the VrefDQ voltage may be set by DFE_code. For example, a first value of the DFE_code<N:0> results in high and low reference levels having a first amount of deviation relative to the VrefDQ voltage. A second value of the DFE_code<N:0> results in high and low reference levels having a second amount of deviation relative to the VrefDQ voltage different from the first amount. Changing a value of the DFE_code<N:0> code changes the levels of the first and second reference levels.

As previously described, in some embodiments of the disclosure, the range of adjustment for the reference level is between the minimum value and the maximum value for the DFE_code<N:0> code (e.g., between DFE_code<N:0>=all "0" and DFE_code<N:0>=all "1"). For DFE_code<N:0>=all "0," the reference level may be the same as the VrefDQ voltage. For DFE_code<N:0>=all "1," the reference level may be changed by a maximum amount relative to the VrefDQ voltage.

Changing the DFE_code<N:0> code causes a stepwise increase/decrease of the reference level. For example, changing the DFE_code<N:0> from "001" to "010" causes a stepwise change of the reference level. In some embodiments of the disclosure, the amount of the stepwise increase/decrease of the reference level may be based on the number of DFE legs 440 which are active to provide capacitance to one sense node (e.g., sense node CN or CT) relative to the other sense node (e.g., sense node CT or CN). The use of parallel DFE legs may help increase a linearity of the steps by which the threshold level is changed as the DFE_code is changed.

An example operation will be described. A previous latch may store a value of one of the serial bits. For example, if the input buffer circuit 400 is activated by PH270, then the previous latch may have been activated by PH180. Following from that, the previous data may be DPH180 and DPH180B. For the sake of this example, it will be assumed that the previous latch stored a high logical value. Accordingly, the value DPH180 is a logical high, and the value DPH180B is a logical low. Similarly, for the sake of this example, it will be assumed that the DFE code DFE_code is enabling at least one DFE leg 448 (e.g., the DFE_code has at least one non-zero bit).

The value DPH180 being at a logical high means that the active DFE legs 448 in the DFE circuit portion 440(a) are coupled to the node CN. The value DPH180B being at a logical low means that while there may be active DFE legs 448 in the DFE circuit portion 440(b), they are not coupled to the capacitance 442. Instead, in the DFE circuit portion 440(b), a reset signal is active which couples the capacitances 442 to ground to reset their charge. Accordingly, there may be a higher capacitance on the node CN than there is on the node CT. This may raise the threshold voltage of the circuit 400 relative to a reference voltage VrefDQ.

The activation circuit 421 provides power when the PHn clock is active, which causes the p-channel transistors of the input circuit 422 to be conductive and provide power to the sense nodes CN and CT, respectively. In this example, a voltage provided to the first transistor coupled to the external data terminal DQ is less than the VrefDQ voltage provided to the second transistor, which causes the first transistor to be more conductive than the second transistor. As a result, the voltage of the sense node CN increases from the precharge voltage (e.g., ground) more quickly than the voltage of the sense node CT. However, the additional capacitance of the node CN means that the voltage on CN will rise more slowly than it might have otherwise, which increases the level the voltage needs to reach before the latch 430 is tripped. With the voltage of the sense node CN increasing more quickly than the voltage of the sense node CT, the first transistor of the output circuit 424 becomes more conductive than the second transistor of the output circuit 424. The conductive first transistor causes the first output of the latch circuit 430 (at which the DPHn data is provided) to decrease from a precharge voltage (e.g., vdd2) to a low logic level voltage (e.g., ground). The decreasing voltage causes the latch circuit 430 to latch and provide low logic level DPHn data and high logic level DPHnB data.

Figure 5:
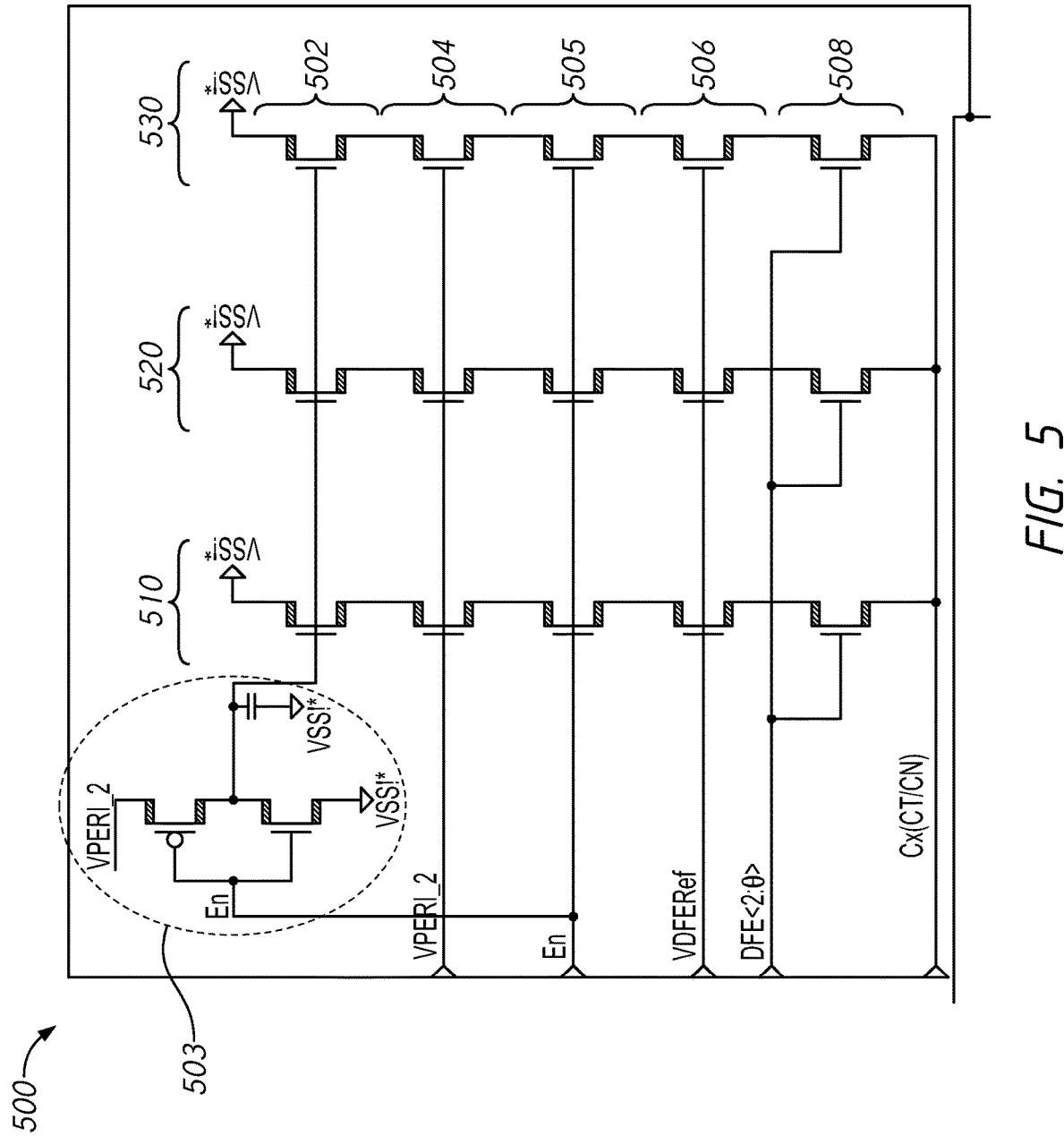
FIG. 5 is a schematic diagram of a portion of a DFE circuit according to some embodiments of the present disclosure.

FIG. 5 is a schematic diagram of a portion of a DFE circuit according to some embodiments of the present disclosure. The portion 500 may represent a portion of a DFE circuit 240 of FIGS. 2 and/or 440 of FIG. 4. For example, the portion 500 may implement the DFE circuit portion 440(a) and/or 440(b) of FIG. 4. In the example DFE portion 500, there are three DFE legs 510, 520, and 530 (e.g., DFE legs 448 of FIG. 4). More or fewer DFE legs may be used in other example embodiments.

Each DFE leg 510-530 may generally be similar to each other, and so for the sake of brevity only one will be described in detail. Each of the legs is coupled in parallel to a sense node Cx of the input buffer. For example, depending on which portion of the DFE circuit the DFE circuit 500 is, the node may be CN or CT. The DFE circuit 500 receives an enable signal En which may be a data bit latched in a previous input buffer. For example, if the DFE circuit 500 is coupled to the node CN, then the enable signal En may be DPH(n−1)B. If the DFE circuit 500 is coupled to the node CT, then the enable signal En may be DPH(n−1). In the embodiment of FIG. 5, the transistors 502-508 are all implemented as n-type transistors, however other embodiments may use p-type transistors and/or a mix of n-type and p-type transistors.

Each leg 510-530 has a first transistor 508 (e.g., 446 of FIG. 3) with a source coupled to the node Cx, a drain coupled to a source of a 506 transistor and a gate coupled to a bit of the DFE code. In the embodiment of FIG. 5, since there are 5 DFE legs 510-530, the DFE code is a 3 bit code DFE<2:0> with each bit activating one of the transistors 508. For example, the transistor 508 in the first leg 510 may be activated by DFE<0>. The second transistor 506 (e.g., 444 of FIG. 4) has a source coupled to the drain of the first transistor 508, a drain coupled to a source of a third transistor 505 and a gate coupled to a bias voltage VDFERef.

Each leg 510-530 also includes a FET 504 which acts as a capacitor and transistors 505 and 502 which selectively couple that FET 504 to the node (when the leg is active) or reset the FET 504 based on the input enable signal En. The transistor 505 has a source coupled to the drain of the second transistor 506, a drain coupled to the FET 504 and a gate coupled to the enable signal En. The FET 504 is coupled in series between transistors 502 and 504 and has a gate coupled to a system voltage VPERI_2. The voltage VPERI_2 may be an internal voltage of the memory which has a similar level to the system voltage VDD2. The transistor 502 has a drain coupled to a ground voltage VSS and a source coupled to the FET 504. A gate of the transistor 502 is coupled to a reset signal Rst.

An inverter 503 is coupled to the enable signal En to provide the reset signal Rst. Accordingly, when the enable signal En has a high logical level, the reset signal Rst may have a low logical level, and when the enable signal En has a low logical level, the reset signal Rst may have a high logical level. In other words, the signal En may match a state of the data bit coupled to the DFE portion 500, and the signal Rst may match a state of the complementary data bit. When the signal Rst is active, the transistors 502 are active, which couples the FETs 504 to ground, to drain a charge on them. When the signal En is active, the transistors 505 are active, coupling the FET through the transistor 508 (if the corresponding bit of the DFE code is active) to the node Cx.

The inverter 503 may include a pair of transistors coupled in series between VPERI_2 and VSS. Each transistor has a gate coupled to En. The transistor coupled to VPERI_2 may be a p-type transistor and the transistor coupled to VSS may be an n-type transistor. The signal Rst may be provided by a node between the two transistors. In this way, if En is active, then Rst is coupled to ground, and if En is inactive, then Rst is coupled to VPERI_2. The inverter 503 may also include a capacitor coupled in series between Rst and a ground voltage.

In some embodiments, each of the DFE legs 510-530 may use different strengths of transistors and FETs 504. This may allow the amount of capacitance coupled to node Cx to be adjusted across a wider range. For example, the leg 520 may have roughly double the strength (and capacitance) of the leg 510, and the leg 530 may have roughly double the strength (and capacitance) of the leg 520. In this way, the DFE code may act as a binary code and may adjust the total response in steps from 0 to 7 in a relatively linear manner.

Figure 6:
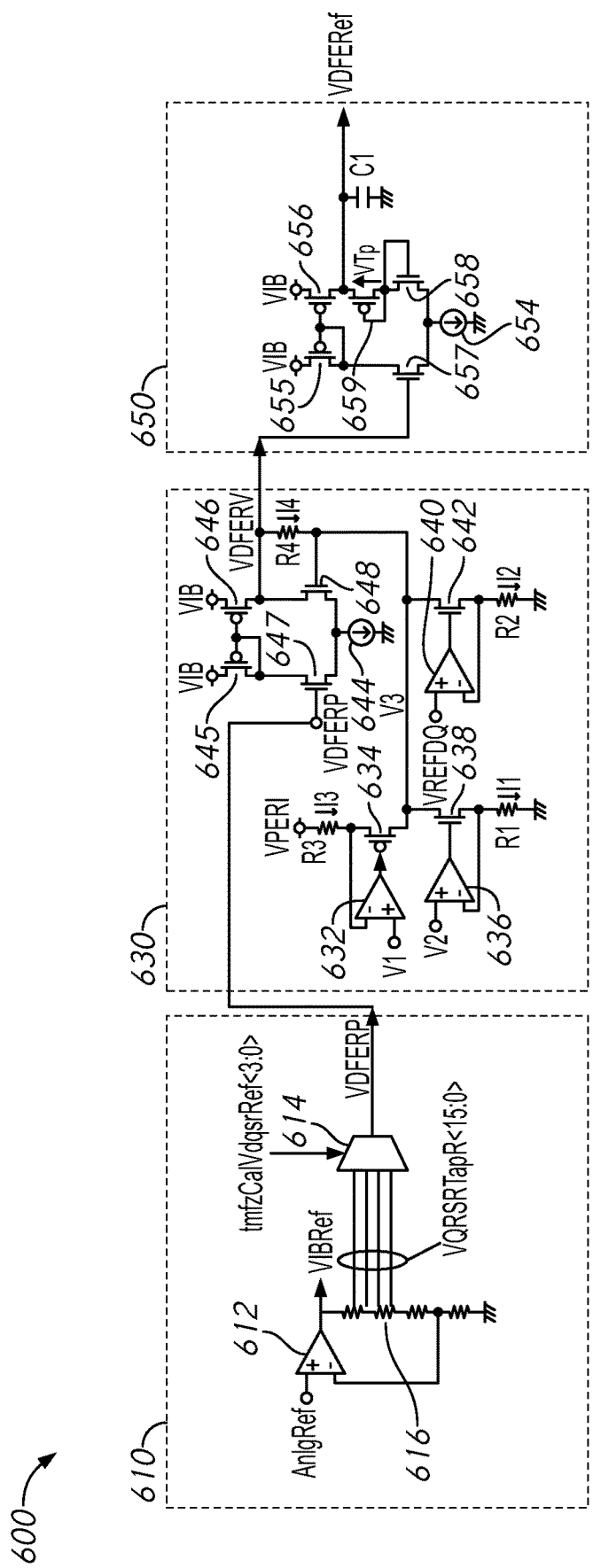
FIG. 6 is a schematic diagram of a bias voltage generator according to some embodiments of the present disclosure.

FIG. 6 is a schematic diagram of a bias voltage generator according to some embodiments of the present disclosure. The voltage generator 600 may, in some embodiments, be included in a voltage generator such as 124 of FIG. 1. The voltage generator 600 provides a bias voltage VDFERef which may be used as the bias voltage of FIGS. 1, 2, 4, and/or 5. The voltage generator 600 may be set up to provide the bias voltage VDFEref in such a manner such that the bias voltage remains relatively stable across a variety of PVT variations.

The voltage generator 600 includes three stages 610, 630, and 650. The first stage 610 provides a process trimmed voltage VDFERP. The first stage may be adjusted based on process variations (e.g., via fuse settings of the device). The second stage 630 provides a voltage adjusted voltage VDFERV based on the trimmed voltage VDFRP. The voltage adjusted voltage VDFRP may have a level which is based, in part, on voltages such as VDD2 and/or VREFDQ which are used by the input buffers. The voltage adjusted voltage VDFRV may compensate for changes in these voltages by being dependent on these voltages. The third stage 630 provides the bias voltage VDFREref based on the voltage adjusted voltage VDFRERV. The third stage 630 may be temperature dependent in order to adjust the voltage VDFREref for temperature variations. In this way process (stage one), voltage (stage two) and temperature (stage three) variations may be corrected for.

The first stage 610 includes an op-amp 612 with a positive terminal coupled to an input voltage AnlgRef and a negative input coupled to a voltage divider 616. The voltage divider may include a number of resistors in series between an output of the op-amp 612 and a ground voltage. The voltage divider provides a number of different outputs VQRSRTapR, which may each have a different voltage. A multiplexer 614 selects one of the voltage outputs from the voltage divider 616 and provides it as the process trimmed voltage VDFERP. The multiplexer 614 selects one of the outputs to provide based on a setting, such as a fuse setting tmfzCalVdqsrRef. The fuse setting may be based on measured process properties of the circuit during testing.

The second stage 620 receives the voltage VDFERP from the first stage and provides VDFERV based on the voltage VDFERP and system voltages such as VDD2 and/or VREFDQ. The second stage includes a pair of op-amps 632 and 636 which provide a voltage dependent reference V3. The voltage V3 is dependent on a system voltage VDD2 (or VPERI) which is used by the input buffer (e.g., 400 of FIG. 4). In some embodiments, an additional op-amp 640 may be enabled to further make V3 dependent on the reference voltage VREFDQ. An amplifier (e.g., transistors 645-648 and current source 644) provides VDFERV based on VDFERP and V3.

The second stage 620 includes a voltage dependent reference V3 generator (e.g., components 632-642 and R1-R3). The first op-amp 632 has a negative input coupled to VDD2 (e.g., VPERI) through a resistor R3, a positive output coupled to a first voltage V1, and an output coupled to a node of a transistor 634. The transistor 634 may be a p-type transistor. The transistor 634 is coupled between VDD2 (through R3) and the voltage V3. The op-amp 636 has a positive input coupled to V2, a negative input coupled through a resistor R1 to a ground voltage and an output coupled to a gate of a transistor 638. The transistor 638 is coupled between V3 and through R1 to a ground voltage. The transistor 638 may be a n-type transistor. Accordingly, a current I3 may flow through R3, and a current I1 may flow through R1. The voltage on V3 may be dependent based on the voltages V1 and V2 (which may be set to control the voltage V3) and the system voltage VDD2 (e.g., VPERI).

An additional op-amp 640 has a positive input coupled to the reference voltage VREFDQ and a negative output coupled through a resistor R2 to a ground voltage. The op-amp 640 has an output coupled to a gate of a transistor 642, which is coupled between V3 and through R2 to the ground voltage. The transistor 642 may be an n-type transistor. The op-amp 640 may be selectively activated based on a setting of the memory to control if and to what degree the voltage V3 is dependent on the reference voltage VREFDQ.

The amplifier of the second stage 630 includes a first transistor 645 coupled between a voltage VIB and a first node. The first node is coupled to a gate of the first transistor 645 and a gate of a second transistor 646. The second transistor 646 is coupled between the voltage VIB and a second node. The transistors 645 and 646 may be p-type transistors. The amplifier includes a third transistor 647 coupled between the first node and a third node and a fourth transistor 648 coupled between the second node and the third node. The third node is coupled to ground through a current source 644. The third transistor 647 has a gate coupled to VDFERP. The fourth transistor 648 has a gate coupled to V3. The voltage V3 is coupled to VDFERP through a resistor R4. The transistors 647 and 648 may be n-type transistors.

The voltage output VDFERV may thus be dependent on VDFERP and on the voltage dependent reference voltage V3. The voltage V3 may depend on VDD2 (e.g., VPERI) and may optionally also depend on VREFDQ.

The third stage 650 includes an amplifier (e.g., transistors 655-659 and current source 654). The amplifier of the third stage 650 may be generally similar to the amplifier of the second stage, but the amplifier of the third stage may include an extra transistor 659 to decrease a temperature dependence of the amplifier. The third stage includes a first transistor 655 coupled between a voltage VIB and a first node and a second transistor 656 coupled between VIB and a second node. The first node is coupled in common to the gates of the first and the second transistors 655 and 656. The transistors 655 and 656 may be p-type transistors. A third transistor 657 is coupled between the first node and a third node. The gate of the transistor 657 is coupled to VDFERV. The third node is coupled through a current source 654 to a ground voltage. The third node is coupled through a transistor 658 to a fourth node. A transistor 659 is coupled between the fourth node and the second node. The gates of the transistors 659 and 658 have gates coupled in common to the fourth node. The transistors 655, 656 and 659 may be p-type transistors and the transistors 657 and 658 may be n-type transistors.

The transistors 659 and 658 may provide a voltage VTp to the second node. The second node provides the bias voltage VDFERef. The bias voltage VDFERef may also be coupled through a capacitor C1 to ground to help regulate changes in the voltage VDFERef, for example to help cut down on kickback noise. The third stage 650 may be responsive to changes in temperature. Based on the effects of the three stages, the overall voltage VDFERef may be relatively stable across a range of PVT variations.

Figure 7:
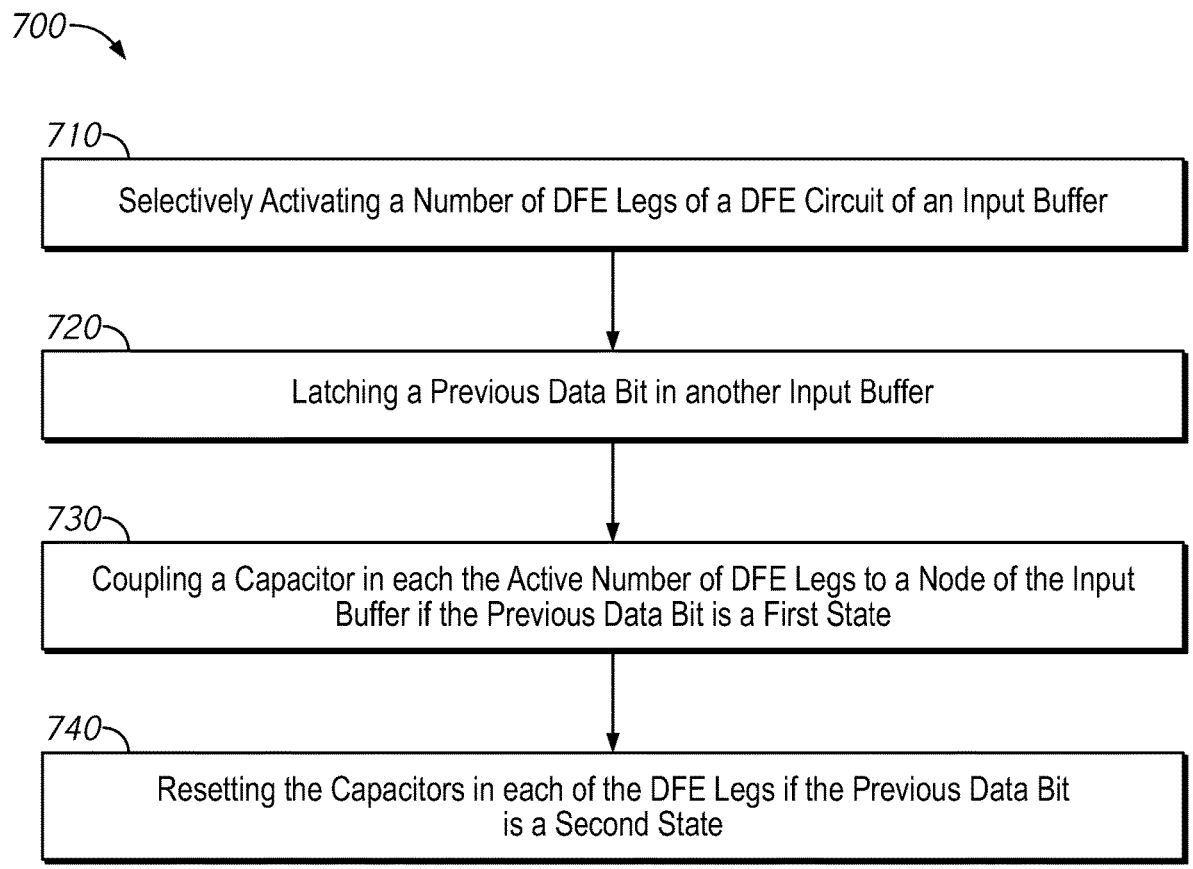
FIG. 7 is a flow chart of a method according to some embodiments of the present disclosure.

FIG. 7 is a flow chart of a method according to some embodiments of the present disclosure. The method 700 may, in some embodiments, be implemented by one or more of the apparatuses and/or systems described in FIGS. 1-6.

The method 700 includes block 710, which describes selectively activating a number of DFE legs (e.g., 448 of FIG. 4) of a DFE circuit of an input buffer. The number of DFE legs may be selected based on a DFE code. The DFE code has a value based on a setting in mode register. The DFE legs are coupled in parallel to a node of the input buffer.

The method 700 may include receiving a series of data bits at a data terminal (e.g., a DQ pad) of the device. The method 700 includes block 720, which describes latching a previous data bit in another input buffer. For example, if the input buffer represents an Nth bit, then the previous data bit may be the (N−1)th bit. A value of the previous data bit may be based, in part, on a comparison of a voltage to a threshold of the another input buffer.

The method includes block 730, which describes coupling a capacitor in each the active number of DFE legs to a node of the input buffer if the previous data bit is a first state. The method 700 may include adjusting a threshold of the input buffer. The number of coupled capacitors (e.g., the number of active DFE legs) may determine how much the threshold is adjusted by.

The method 700 includes block 740, which describes resetting the capacitors in each of the DFE legs if the previous data bit is a second state. For example, the method 700 may include inverting the previous data bit with an inverter circuit (e.g., 503 of FIG. 5) to generate a reset signal at an active level when the previous data bit is in the second state, and coupling the capacitors to ground when the reset signal is at the active level.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a data terminal configured to receive a series of voltages which represent a logical state of a series of bits;
   a latch configured to compare one of the series of voltages to a threshold voltage and latch a logical value of one of the series of bits based on the comparison, wherein the threshold voltage is based, at least in part, on a capacitance of a node of the latch; and
   a data feedback equalization circuit configured to set the threshold voltage based on a value of a previous of the series of bits, wherein the DFE circuit includes:
   a plurality of capacitors;
   a plurality of transistors configured to couple a respective one of the plurality of capacitors to the node of the latch when active, wherein the plurality of transistors are coupled in parallel between the node and the associated one of the plurality of capacitors, wherein selected ones of the plurality of transistors are activated based on a DFE code.

2. The apparatus of claim 1, wherein the plurality of capacitors are field effect transistors (FETs).

3. The apparatus of claim 1, wherein the plurality of capacitors are selectively coupled to the associated one of the plurality of transistors based on a state of the previous of the series of bits.

4. An apparatus comprising:
a data terminal configured to receive a series of voltages which represent a logical state of a series of bits;
a latch configured to compare one of the series of voltages to a threshold voltage and latch a logical value of one of the series of bits based on the comparison, wherein the threshold voltage is based, at least in part on a capacitance of a node of the latch; and
a data feedback equalization circuit configured to set the threshold voltage based on a value of a previous of the series of bits, wherein the DFE circuit includes:
a plurality of capacitors;
a plurality of transistors configured to couple a respective one of the plurality of capacitors to the node of the latch when active, wherein the plurality of transistors are coupled in parallel between the node and the associated one of the plurality of capacitors, wherein the DFE circuit further comprises an inverter configured to generate a reset signal based on a state of the previous of the series of bits, and wherein the plurality of capacitors are coupled to a ground voltage based on the reset signal.

5. An apparatus comprising:
a data terminal configured to receive a series of voltages which represent a logical state of a series of bits;
a latch configured to compare one of the series of voltages to a threshold voltage and latch a logical value of one of the series of bits based on the comparison, wherein the threshold voltage is based, at least in part, on a capacitance of a node of the latch;
a data feedback equalization circuit configured to set the threshold voltage based on a value of a previous of the series of bits, wherein the DFE circuit includes:
a plurality of capacitors; and
a plurality of transistors configured to couple a respective one of the plurality of capacitors to the node of the latch when active, wherein the plurality of transistors are coupled in parallel between the node and the associated one of the plurality of capacitors; and
a second plurality of transistors each coupled between a respective one of the plurality of transistors and the associated one of the plurality of capacitors, wherein each of the second plurality of transistors has a control node coupled to a bias voltage.

6. An apparatus comprising:
a data terminal configured to receive a series of voltages which represent a logical state of a series of bits;
a latch configured to compare one of the series of voltages to a threshold voltage and latch a logical value of one of the series of bits based on the comparison, wherein the threshold voltage is based, at least in part, on a capacitance of a node of the latch;
a data feedback equalization circuit configured to set the threshold voltage based on a value of a previous of the series of bits, wherein the DFE circuit includes:
a plurality of capacitors; and
a plurality of transistors configured to couple a respective one of the plurality of capacitors to the node of the latch when active, wherein the plurality of transistors are coupled in parallel between the node and the associated one of the plurality of capacitors; and a bias voltage generator configured to provide the bias voltage, wherein the bias voltage generator compensates for variations in process, voltage, and temperature.

7. An apparatus comprising:
a sense circuit configured to compare a voltage of input data with a reference voltage and provide first and second voltages to first and second sense nodes respectively, based on the comparison;
a latch circuit configured to latch and provide output data having logic levels based on voltages on the first and the second sense nodes,
a first data feedback equalization (DFE) circuit portion coupled to the first sense node, the first DFE circuit portion configured to couple a selectable number of a first plurality of DFE legs to the first sense node, wherein each of the first plurality of DFE legs includes one of a first plurality of capacitors configured to be coupled to the first sense node when a first input voltage is in a first state and when the associated one of the first plurality of DFE legs is selected, wherein the first plurality DFE legs are coupled in parallel to the first sense node; and
a second DFE circuit portion coupled to the second sense node, the second DFE circuit portion configured to couple a selectable number of a second plurality of DFE legs to the second sense node, wherein each of the second plurality of DFE legs includes one of a second plurality of capacitors configured to be coupled to the second sense node when a second input voltage is in a first state, wherein the second plurality of DFE legs are coupled in parallel to the second sense node, wherein the first input voltage represents a logical state of a bit stored in another latch circuit and wherein the second input voltage represents a logical state of a compliment of the bit stored in the another latch circuit.

8. The apparatus of claim 7, further comprising a data terminal configured to provide a series of bits, wherein the input data represents a current of the series of bits and the bit stored in the another latch represents a previous of the series of bits.

9. The apparatus of claim 7, wherein the selected number of the first plurality of DFE legs and the selected number of the second plurality of DFE legs are selected based on a DFE code.

10. The apparatus of claim 7, wherein the first plurality of capacitors and the second plurality of capacitors are field effect transistors.

11. An apparatus comprising:
a sense circuit configured to compare a voltage of input data with a reference voltage and provide first and second voltages to first and second sense nodes respectively, based on the comparison;
a latch circuit configured to latch and provide output data having logic levels based on voltages on the first and the second sense nodes;
a first data feedback equalization (DFE) circuit portion coupled to the first sense node, the first DFE circuit portion configured to couple a selectable number of a first plurality of DFE legs to the first sense node, wherein each of the first plurality of DFE legs includes one of a first plurality of capacitors configured to be coupled to the first sense node when a first input voltage is in a first state and when the associated one of the first plurality of DFE legs is selected, wherein the first plurality DFE legs are coupled in parallel to the first sense node; and a second DFE circuit portion coupled to the second sense node, the second DFE circuit portion configured to couple a selectable number of a second plurality of DFE legs to the second sense node, wherein each of the second plurality of DFE legs includes one of a second plurality of capacitors configured to be coupled to the second sense node when a second input voltage is in a first state, wherein the second plurality of DFE legs are coupled in parallel to the second sense node, wherein the first plurality of capacitors are coupled to a ground voltage when the first input voltage is in a second state and wherein the second plurality of capacitors are coupled to the ground voltage when the second input voltage is in the second state.

12. An apparatus comprising:
a sense circuit configured to compare a voltage of input data with a reference voltage and provide first and second voltages to first and second sense nodes respectively, based on the comparison;
a latch circuit configured to latch and provide output data having logic levels based on voltages on the first and the second sense nodes;
a first data feedback equalization (DFE) circuit portion coupled to the first sense node, the first DFE circuit portion configured to couple a selectable number of a first plurality of DFE legs to the first sense node, wherein each of the first plurality of DFE legs includes one of a first plurality of capacitors configured to be coupled to the first sense node when a first input voltage is in a first state and when the associated one of the first plurality of DFE legs is selected, wherein the first plurality DFE legs are coupled in parallel to the first sense node; and
a second DFE circuit portion coupled to the second sense node, the second DFE circuit portion configured to couple a selectable number of a second plurality of DFE legs to the second sense node, wherein each of the second plurality of DFE legs includes one of a second plurality of capacitors configured to be coupled to the second sense node when a second input voltage is in a first state, wherein the second plurality of DFE legs are coupled in parallel to the second sense node, wherein the first plurality of DFE legs further comprises a first plurality of transistors, wherein the second plurality of DFE legs further comprises a second plurality of transistors, and wherein the first plurality of transistors and the second plurality of transistors have a control node coupled to a bias voltage.

13. An apparatus comprising:
a node of an input buffer circuit, wherein a logical value latched in the input buffer circuit is based, in part, on a capacitance of the node;
a DFE circuit coupled to the node, the DFE circuit comprising:
a first capacitor;
a first transistor configured to be selectively activated by a DFE code;
a second transistor with a gate coupled to a bias voltage, wherein the first transistor and the second transistor are coupled in series between the node and the first capacitor;
a second capacitor;
a third transistor configured to be selectively activated by the DFE code; and
a fourth transistor with a gate coupled to the bias voltage, wherein the third transistor and the fourth transistor are coupled in series between the node and the second capacitor.

14. The apparatus of claim 13, wherein the first transistor and the third transistor are coupled in parallel to the node.

15. The apparatus of claim 13, wherein the DFE circuit further comprises:
a third capacitor;
a fifth transistor configured to be selectively activated by the DFE code; and
a sixth transistor with a gate coupled to the bias voltage, wherein the fifth and the sixth transistors are coupled in series between with node and the third capacitor.

16. The apparatus of claim 13, wherein the first capacitor is coupled to the second transistor and wherein the second capacitor is coupled to the fourth transistor when an input bit has a first state.

17. The apparatus of claim 16, further comprising an inverter circuit configured to provide a reset signal at an active level when the input bit has a second state, wherein when the reset signal is at the active level the first capacitor and the second capacitor are coupled to a ground voltage.

18. The apparatus of claim 13, wherein the first capacitor and the second capacitor are different sizes.

* * * * *